(12) United States Patent
Baum et al.

(10) Patent No.: US 11,107,675 B2
(45) Date of Patent: *Aug. 31, 2021

(54) CVD MO DEPOSITION BY USING MOOCL$_4$

(71) Applicant: Entegris, Inc., Billerica, MA (US)

(72) Inventors: Thomas H. Baum, Billerica, MA (US); Philip S. H. Chen, Billerica, MA (US); Robert L. Wright, Billerica, MA (US); Bryan Hendrix, Billerica, MA (US); Shuang Meng, Billerica, MA (US); Richard Assion, Billerica, MA (US)

(73) Assignee: ENTEGRIS, INC., Billerica, MA (US)

( * ) Notice: Subject to any disclaimer, the term of this patent is extended or adjusted under 35 U.S.C. 154(b) by 248 days.

This patent is subject to a terminal disclaimer.

(21) Appl. No.: 15/963,656

(22) Filed: Apr. 26, 2018

(65) Prior Publication Data
US 2018/0286668 A1    Oct. 4, 2018

Related U.S. Application Data

(63) Continuation-in-part of application No. 15/963,656, filed on Jul. 13, 2017, now abandoned.
(Continued)

(51) Int. Cl.
*H01L 21/02* (2006.01)
*C23C 16/06* (2006.01)
(Continued)

(52) U.S. Cl.
CPC .... *H01L 21/02175* (2013.01); *C23C 16/0272* (2013.01); *C23C 16/045* (2013.01);
(Continued)

(58) Field of Classification Search
CPC .......................... C23C 16/06; H01L 21/76876
See application file for complete search history.

(56) References Cited

U.S. PATENT DOCUMENTS 3,177,084 A  4/1965 Amstein
3,437,515 A  4/1969 Quinn
(Continued)

FOREIGN PATENT DOCUMENTS

CN    101308794 B    9/2010
CN    105097446 A    11/2015
(Continued)

OTHER PUBLICATIONS

Allred, David D., et al.; Spectrally Selective Surfaces by Chemical Vapor Deposition; Solar Energy Materials 12, pp. 87-129, 1995.
(Continued)

*Primary Examiner* — Kelly M Gambetta
(74) *Attorney, Agent, or Firm* — Entegris, Inc.

(57) ABSTRACT

A method of forming a molybdenum-containing material on a substrate is described, in which the substrate is contacted with molybdenum oxytetrachloride (MoOCl$_4$) vapor under vapor deposition conditions, to deposit the molybdenum-containing material on the substrate. In various implementations, a diborane contact of the substrate may be employed to establish favorable nucleation conditions for the subsequent bulk deposition of molybdenum, e.g., by chemical vapor deposition (CVD) techniques such as pulsed CVD.

17 Claims, 17 Drawing Sheets

Related U.S. Application Data

(60) Provisional application No. 62/362,582, filed on Jul. 14, 2016.

(51) Int. Cl.

| | |
|---|---|
| *C23C 16/455* | (2006.01) |
| *H01L 21/768* | (2006.01) |
| *H01L 21/285* | (2006.01) |
| *C23C 16/02* | (2006.01) |
| *C23C 16/04* | (2006.01) |
| *H01L 23/532* | (2006.01) |

(52) U.S. Cl.
CPC ........ *C23C 16/06* (2013.01); *C23C 16/45523* (2013.01); *H01L 21/0228* (2013.01); *H01L 21/02205* (2013.01); *H01L 21/28556* (2013.01); *H01L 21/76876* (2013.01); *H01L 21/76877* (2013.01); *H01L 23/53257* (2013.01)

(56) References Cited

U.S. PATENT DOCUMENTS

| | | | |
|---|---|---|---|
| 3,996,489 A | | 12/1976 | Byrum, Jr. et al. |
| 6,284,366 B1 | | 9/2001 | König |
| 6,416,890 B1 | * | 7/2002 | Terneu ................ C03C 17/3417 |
| | | | 428/701 |
| 10,453,744 B2 | * | 10/2019 | Meng ................ H01L 21/28556 |
| 2003/0124794 A1 | | 7/2003 | Girardie |
| 2004/0042931 A1 | | 3/2004 | Wit et al. |
| 2005/0131255 A1 | | 6/2005 | Benderly et al. |
| 2005/0202965 A1 | | 9/2005 | Cavalcanti et al. |
| 2005/0239643 A1 | | 10/2005 | Benderly et al. |
| 2006/0122055 A1 | | 6/2006 | Gaffney et al. |
| 2007/0106088 A1 | | 5/2007 | Benderly et al. |
| 2007/0106089 A1 | | 5/2007 | Benderly et al. |
| 2007/0203378 A1 | | 8/2007 | Area et al. |
| 2008/0154056 A1 | | 6/2008 | Gaffney et al. |
| 2008/0170984 A1 | | 7/2008 | Tenne et al. |
| 2009/0272672 A1 | | 11/2009 | Area et al. |
| 2015/0262828 A1 | * | 9/2015 | Brand ............... H01L 29/42392 |
| | | | 438/592 |
| 2016/0038923 A1 | | 2/2016 | Yu et al. |
| 2017/0306490 A1 | * | 10/2017 | Chan ...................... C23C 16/08 |

FOREIGN PATENT DOCUMENTS

| | | |
|---|---|---|
| EP | 0241190 A3 | 10/1987 |
| EP | 13238451 A | 7/2003 |
| EP | 1658895 A1 | 5/2006 |
| EP | 1661620 A1 | 5/2006 |
| GB | 806696 A | 12/1958 |
| GB | 1325376 A | 8/1973 |
| JP | S62290874 A | 12/1987 |
| WO | 2009042713 A1 | 4/2009 |

OTHER PUBLICATIONS

Kaplan L H et al: "The Deposition of Molybdenum and Tungsten Films From Vapor Decomposition of Carbonyls" Journal of the Electrochemical SOC, Electrochemical Society, Inc, US vol. 117, No. 5, May 1, 1970 (May 1, 1970) pp. 693-700.

* cited by examiner

CVD MO DEPOSITION BY USING MOOCL₄

PRIORITY CLAIM

This application is a continuation-in-part of U.S. Ser. No. 15/649,248, filed Jul. 13, 2017, which in turn claims priority to U.S. provisional patent application having U.S. Ser. No. 62/362,582, filed Jul. 14, 2016, both of which are incorporated herein by reference in their entireties for all purposes.

FIELD

The present disclosure relates to vapor deposition of molybdenum-containing material. In particular, though not exclusively, the present disclosure relates to the use of molybdenum oxytetrachloride ($MoOCl_4$) as a precursor for such deposition.

DESCRIPTION OF RELATED ART

In consequence of its characteristics of extremely high melting point, low coefficient of thermal expansion, low resistivity, and high thermal conductivity, molybdenum is increasingly utilized in the manufacture of semiconductor devices, including use in diffusion barriers, electrodes, photomasks, power electronics substrates, low-resistivity gates, and interconnects.

Such utility has motivated efforts to achieve deposition of molybdenum films for such applications that is characterized by high conformality of the deposited film and high deposition rate to accommodate efficient high-volume manufacturing operations. This in turn has informed efforts to develop improved molybdenum source reagents useful in vapor deposition operations, as well as improved process flows utilizing such reagents.

Molybdenum pentachloride is most commonly used as a molybdenum source for chemical vapour deposition of molybdenum-containing material. However, there remains a need to achieve deposition of molybdenum-containing material with higher deposition rates to accommodate efficient high-volume manufacturing operations.

SUMMARY

The present disclosure relates to vapor deposition of molybdenum-containing material, and more specifically to the use of molybdenum oxytetrachloride ($MoOCl_4$) as a source reagent for such vapor deposition, as well as to processes and devices employing molybdenum oxytetrachloride ($MoOCl_4$) as a source reagent.

In one aspect, the disclosure relates to a method of forming a molybdenum-containing material on a substrate, comprising contacting the substrate with molybdenum oxytetrachloride ($MoOCl_4$) vapor under vapor deposition conditions, to deposit the molybdenum-containing material on the substrate.

In various embodiments, the disclosure relates to a method of forming a molybdenum-containing material on a substrate, comprising contacting the substrate with diborane under contacting conditions establishing nucleation surface on the substrate, and depositing molybdenum on the nucleation surface by a vapor deposition process utilizing molybdenum oxytetrachloride ($MoOCl_4$) precursor, to produce the molybdenum-containing material on the substrate.

Other aspects, features and embodiments of the disclosure will be more fully apparent from the ensuing description and appended claims.

DETAILED DESCRIPTION

Figure 1:
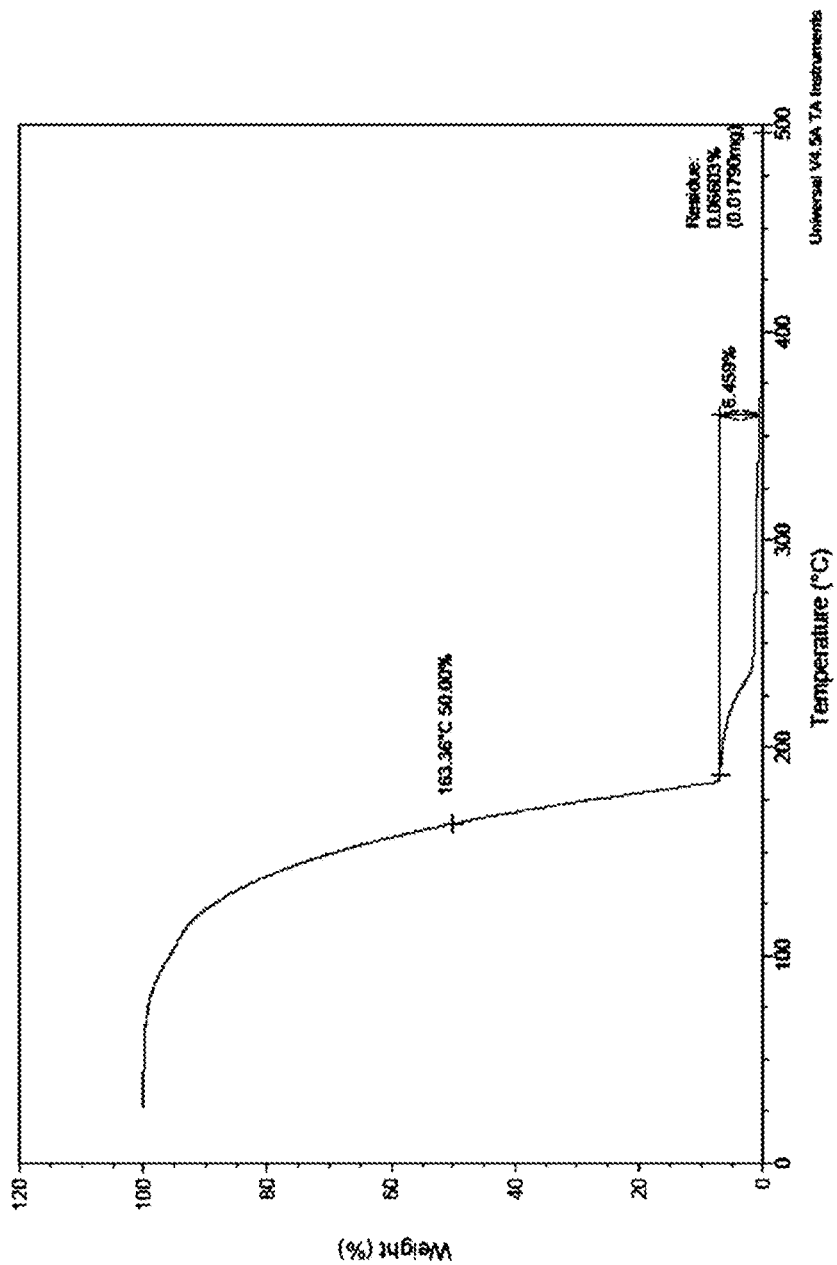
FIG. 1 is a graph of the thermogravimetric analysis (TGA) of molybdenum oxytetrachloride.

The present disclosure relates to vapor deposition of molybdenum, and to use of molybdenum oxytetrachloride ($MoOCl_4$) for such deposition, e.g., in the manufacture of semiconductor devices in which molybdenum films of superior conformality and performance properties are desired.

In accordance with the present disclosure, molybdenum oxytetrachloride ($MoOCl_4$) has been found in vapor deposition processes such as chemical vapor deposition to provide low resistivity, high deposition rate films of a highly conformal character.

The disclosure relates in one aspect to a method of forming a molybdenum-containing material on a substrate, comprising contacting the substrate with molybdenum oxytetrachloride ($MoOCl_4$) vapor under vapor deposition conditions, to deposit the molybdenum-containing material on the substrate.

It has been found that, in various embodiments of the disclosure, the use of molybdenum oxytetrachloride ($MoOCl_4$) as a precursor for vapor deposition of molybdenum-containing material on substrates can provide a surprisingly high extent of conformality, approaching 100% conformality, as determined by cross-sectional scanning electron microscopy imaging techniques. Advantageously, ($MoOCl_4$), deposition of molybdenum oxytetrachloride ($MoOCl_4$) can proceed at higher rates than deposition of molybdenum pentachloride ($MoCl_5$). Furthermore, surprisingly despite the presence of oxygen in the structure of molybdenum oxytetrachloride ($MoOCl_4$), the molybdenum-containing material can have low resistivity and oxygen content.

In various embodiments, the method comprises establishing a nucleation surface on the substrate and said contacting of the substrate with molybdenum oxytetrachloride ($MoOCl_4$) vapor comprises contacting the nucleation surface of the substrate with molybdenum oxytetrachloride ($MoOCl_4$) vapor to deposit the molybdenum-containing material on the substrate.

A nucleation surface may advantageously facilitate deposition of low resistivity molybdenum-containing material on the substrate at lower temperatures.

Establishing the nucleation surface on the substrate may suitably comprise contacting the substrate with diborane vapor and optionally separately with molybdenum oxytetrachloride ($MoOCl_4$) vapor. Advantageously, establishing the nucleation surface may comprise a plurality of cycles of contacting the substrate with diborane vapor and separately with molybdenum oxytetrachloride ($MoOCl_4$) vapor. In various embodiments, contact of the titanium nitride layer with diborane vapor is conducted at temperature in a range of from 300° C. to 450° C.

Advantageously, the vapor deposition conditions may be pulsed. It has been found that this can improve step coverage of the deposition. Suitably the "pulse" and "purge" time of pulsed deposition may each independently be in the range of from 1 to 20 seconds.

In various embodiments, the vapor conditions are selected such that the deposited molybdenum-containing material has a resistivity of at most 20 $\mu\Omega$-cm, optionally at most 15 $\mu\Omega$-cm.

Suitably, the molybdenum-containing material may be deposited at a (stage) temperature in the range of from 400° C. to 750° C., or in the range of from 400° C. to 600° C., or in the range of from 400° C. to 575° C. Suitably, the molybdenum-containing material may be deposited at a (stage) temperature in the range of from 450° C. to 750° C., or in the range of from 450° C. to 600° C., or in the range of from 450° C. to 575 ° C. Suitably, the molybdenum-containing material may be deposited at a (stage) temperature in the range of from 500° C. to 750° C., or in the range of from 500° C. to 600° C., or in the range of from 500° C. to 575° C.

In various embodiments, the vapor deposition conditions comprise an inert atmosphere, save for the optional presence of a reducing agent such as hydrogen. Suitably, the molybdenum oxytetrachloride ($MoOCl_4$) vapor may be deposited in the substantial absence of other metal vapors.

The method may comprise volatilizing molybdenum oxytetrachloride ($MoOCl_4$) to form the molybdenum oxytetrachloride ($MoOCl_4$) vapor for the vapor deposition operation. The vapor deposition conditions may be of any suitable type, and may for example comprise a reducing ambient so that the molybdenum-containing material comprises elemental molybdenum material. The molybdenum-containing material may comprise, or alternatively consist, or consist essentially of, elemental molybdenum, or molybdenum oxide, or other molybdenum-containing material.

The substrate utilized in the method of the disclosure may be of any suitable type, and may for example comprise a semiconductor device substrate, e.g., a silicon substrate, a silicon dioxide substrate, or other silicon-based substrate. In various embodiments, the substrate may comprise one or more of TiN, Mo, MoC, B, $SiO_2$, W, and WCN.

Advantageously, for example in the case of an oxide substrate such as silicon dioxide, or alternatively a silicon or polysilicon substrate, the substrate may be processed or fabricated to include a barrier layer thereon, e.g. titanium nitride, for subsequently deposited material. By way of illustration, the substrate may comprise a nucleation layer on a titanium nitride layer, with the molybdenum-containing material being deposited on the nucleation layer in the appertaining process flow sequence.

Such a nucleation layer or surface may for example be formed by pulsed CVD or ALD or other vapor deposition technique, and the formation of such a nucleation layer may be carried out by contacting of the titanium nitride layer with diborane vapor and separately with molybdenum oxytetrachloride ($MoOCl_4$) vapor. The respective diborane vapor and molybdenum oxytetrachloride ($MoOCl_4$) vapor contacting steps may be carried out alternatingly and repetitively for as many cycles as are desired to form the nucleation layer of desired thickness. The process conditions for such nucleation layer formation may comprise any suitable desired temperature, pressure, flow rate, and other process conditions. In various embodiments, the contact of the titanium nitride layer with diborane vapor is conducted at temperature in a range of from 300° C. to 450° C. In various embodiments, the contact of the titanium nitride layer with molybdenum oxytetrachloride ($MoOCl_4$) vapor is conducted at temperature in a range of from 400° C. to 575° C., or another range as defined hereinabove for ($MoOCl_4$) vapor deposition.

Subsequent to formation of a nucleation layer by contact of a substrate with diborane vapor and separately with molybdenum oxytetrachloride ($MoOCl_4$) vapor, the molybdenum-containing material can be deposited on the nucleation layer, to form a bulk deposit of elemental molybdenum or molybdenum oxide or other molybdenum-containing compound or composition.

In various embodiments, the molybdenum-containing material is deposited on the nucleation layer or surface at temperature in a range of from 400° C. to 575° C. or another range as defined hereinabove for ($MoOCl_4$) vapor deposition. The process may be carried out, so that the vapor deposition conditions produce deposition of elemental molybdenum as the molybdenum-containing material on the nucleation layer of the substrate. The vapor deposition conditions may be of any suitable character, and may for example comprise presence of hydrogen or other reducing gas, to form a bulk layer of elemental molybdenum on the nucleation layer.

More generally, the broad method of forming a molybdenum-containing material on a substrate in accordance with the present disclosure may comprise vapor deposition conditions comprising presence of hydrogen or other reducing gas. The molybdenum-containing material may be deposited on the barrier layer or nucleation layer or surface in the presence or absence of hydrogen. For example, the barrier layer may be constituted by titanium nitride, and the titanium nitride layer may be contacted with molybdenum oxytetrachloride ($MoOCl_4$) vapor in the presence of hydrogen.

It will be appreciated that the method of the present disclosure may be carried out in numerous alternative ways, and under a wide variety of process conditions. The method of the disclosure may for example be carried out in a process for making a semiconductor device on the substrate. The semiconductor device may be of any suitable type, and may for example comprise a DRAM device, 3-D NAND device, or other device or device precursor structure. In various embodiments, the substrate may comprise a via in which the molybdenum-containing material is deposited. The via may for example have an aspect ratio of depth to lateral dimension that is in a range of from 20:1 to 30:1.

The process chemistry for depositing molybdenum-containing material in accordance with the present disclosure may include deposition of elemental molybdenum, Mo(0), by the reaction $MoOCl4+3H2 \rightarrow Mo+4 HCl+H2O$. A nucleation layer or surface formed as described hereinabove by successive contacting of the substrate with diborane and $MoOCl_4$ to form the nucleation layer may involve the formation reaction of $2MoOCl_4+B_2H_6 \rightarrow 2Mo+2BOCl+6HCl$.

The molybdenum-containing material deposited in accordance with the method of the present disclosure may be characterized by any appropriate evaluation metrics and parameters, such as deposition rate of the molybdenum-containing material, film resistivity of the deposited molybdenum-containing material, film morphology of the deposited molybdenum-containing material, film stress of the deposited molybdenum-containing material, step coverage of the material, and the process window or process envelope of appropriate process conditions. Any appropriate evaluation metrics and parameters may be employed, to characterize the deposited material and correlate same to specific process conditions, to enable mass production of corresponding semiconductor products.

In various embodiments, the disclosure relates to a method of forming a molybdenum-containing material on a substrate, comprising contacting the substrate with diborane under contacting conditions establishing nucleation surface on the substrate, and depositing molybdenum on the nucleation surface by a vapor deposition process utilizing molybdenum oxytetrachloride ($MoOCl_4$) precursor, to produce the molybdenum-containing material on the substrate.

Such method may be carried out in any suitable manner as variously described herein. In specific embodiments, such method may be conducted with a vapor deposition process comprising chemical vapor deposition, e.g., pulsed chemical vapor deposition. The method may be carried out so that the resulting molybdenum-containing material is composed essentially of elemental molybdenum, and in various embodiments the molybdenum may be deposited on the nucleation surface in the presence of hydrogen or other suitable reducing gas. The method may be carried out in the manufacture of a semiconductor product, such as a DRAM device, or a 3-D NAND device.

Generally, the methods of the present disclosure for forming molybdenum-containing material on a substrate may be carried out to achieve deposition of the molybdenum-containing material at high levels of step coverage, e.g., step coverage of from 90 to 110%.

The features and advantages of the methodology of the present disclosure will be more fully apparent from the ensuing description of illustrative embodiments and illustrative examples hereinafter set forth.

Referring firstly to FIG. 1, there is shown a graph of the thermogravimetric analysis (TGA) of molybdenum oxytetrachloride, plotted as weight percent as a function of temperature, in degrees Centigrade, showing the characteristics of the thermal behavior of molybdenum oxytetrachloride. Notably, the T50 of molybdenum oxytetrachloride ($MoOCl_4$) is approximately 20° C. lower than that of molybdenum pentachloride ($MoCl_5$).

Figure 2:
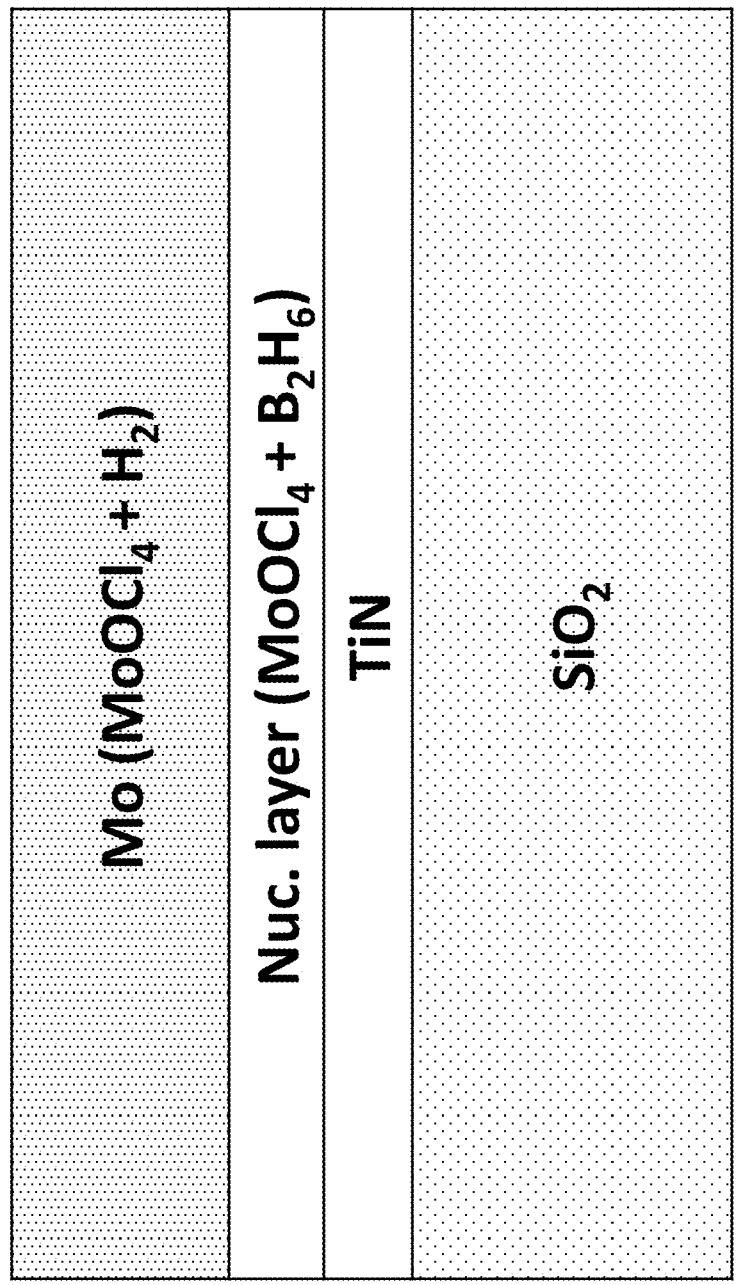
FIG. 2 is a schematic cross-sectional elevation view of a semiconductor device structure comprising molybdenum-containing material deposited in accordance with an embodiment of the present disclosure.

With reference to FIG. 2 a semiconductor device structure comprising molybdenum-containing material deposited in accordance with an embodiment of the present disclosure includes a base layer of silicon dioxide ($SiO_2$), overlying which is a barrier layer of titanium nitride (TiN), over which a nucleation layer has been formed by contact of the substrate with molybdenum oxytetrachloride ($MoOCl_4$) and diborane, with a layer of elemental molybdenum (Mo) as an upper layer deposited on the nucleation layer from molybdenum oxytetrachloride ($MoOCl_4$) in the presence of hydrogen ($H_2$).

The FIG. 2 semiconductor device may be fabricated by the following sequence of process steps on the substrate comprising the titanium nitride barrier layer on the silicon dioxide base layer.

Step 1: contacting the barrier layer (TiN layer) of the substrate with a pulse of diborane ($B_2H_6$), for example at temperature in a range of from 300 to 450° C.; this step may be in the presence or absence of hydrogen (H2) co-reactant gas.

Step 2: pumping/purging the deposition chamber;

Step 3: contacting the barrier layer (TiN layer) of the substrate with a pulse of molybdenum pentachloride ($MoCl_5$) or molybdenum oxytetrachloride ($MoOCl_4$) vapor, in the presence of hydrogen (H2) or argon (Ar), for example at temperature on the order of 500° C.;

Step 4: pumping/purging the deposition chamber;

Step 5: repeating Steps 1-4 (optional) to form a nucleation layer of desired characteristics; and Step 6: depositing bulk molybdenum on the nucleation layer, by contact of the substrate with molybdenum oxytetrachloride ($MoOCl_4$) vapor, in the presence of hydrogen ($H_2$), for example at temperature on the order of 500° C.

Steps 1 to 5 are optional and may be left out if no nucleation layer is required.

EXAMPLE 1

Deposition Rate Study

A chemical vapor deposition (CVD) molybdenum deposition with molybdenum oxytetrachloride ($MoOCl_4$)/hydrogen ($H_2$) was carried out utilizing the following process conditions: a 700° C. stage on which substrate was maintained; a 70° C. ampoule from which the molybdenum oxytetrachloride ($MoOCl_4$) precursor was dispensed for the vapor deposition operation; 60 torr pressure in the vapor deposition operation; 50 standard cubic centimeter per minute (sccm) argon carrier gas flow, and 2000 standard cubic feet per minute (sccm) of hydrogen ($H_2$).

Figure 3:
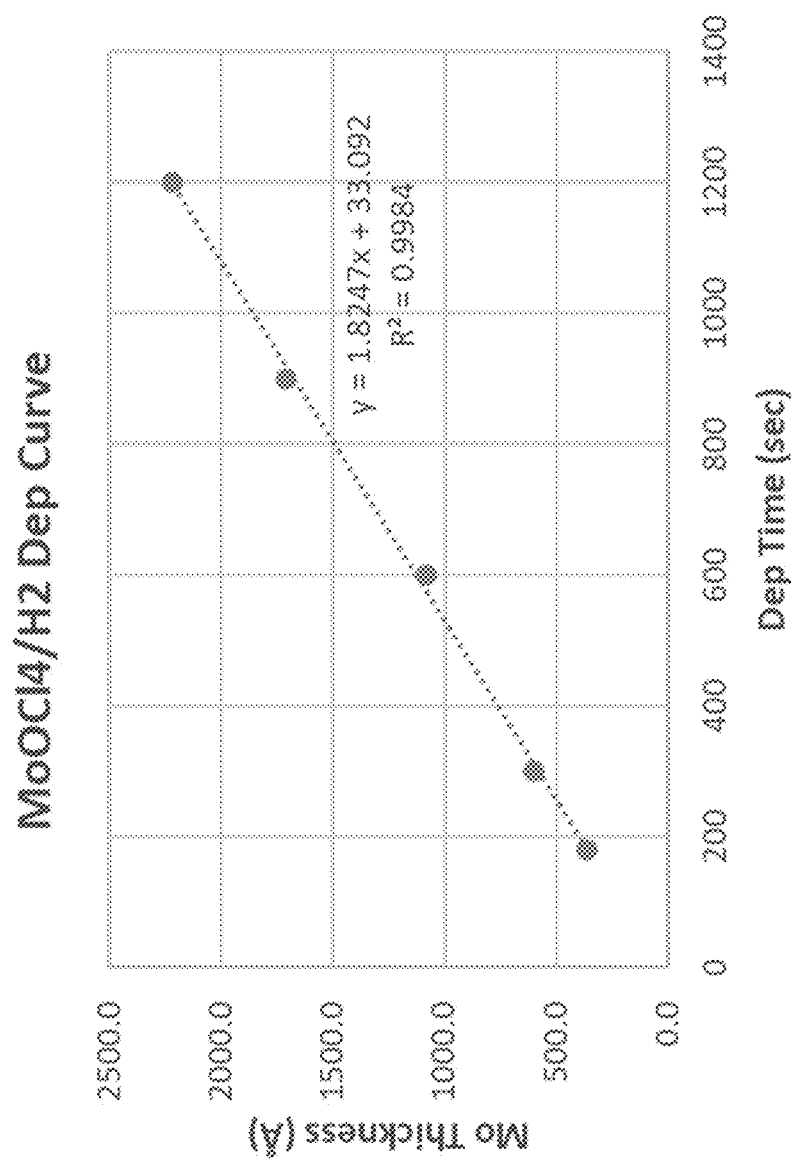
FIG. 3 shows a molybdenum oxytetrachloride ($MoOCl_4$)/hydrogen ($H_2$) deposition curve illustrating results from Example 1.
Figure 4:
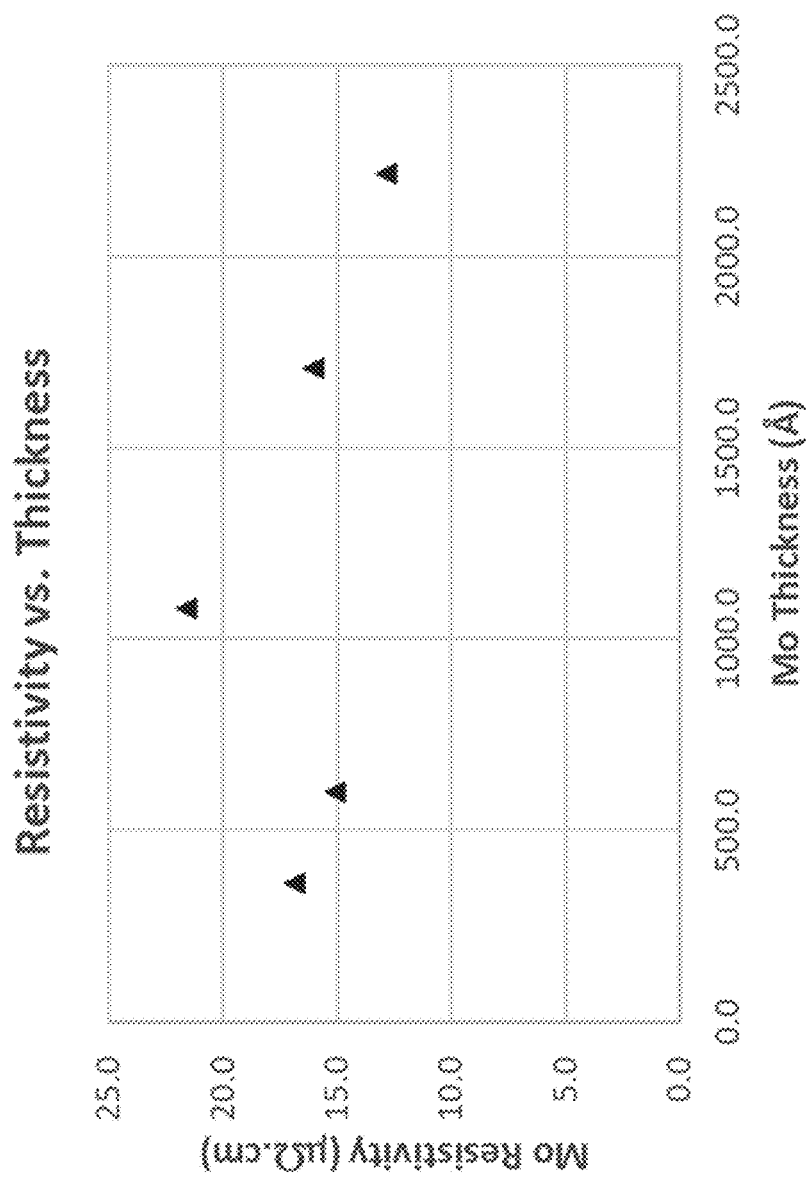
FIG. 4 is a graph of resistivity, as a function of thickness, for deposition of molybdenum by a $MoOCl_4/H_2$ process in accordance with Example 1.

Results of the deposition are shown in FIG. 3 and FIG. 4. The data showed that the chemical vapor deposition (CVD) of molybdenum using the molybdenum oxytetrachloride ($MoOCl_4$)/hydrogen ($H_2$) deposition process at 700° C. exhibited high deposition rate on the order of about 110 Å/minute with the ampoule set at temperature of 70° C.

EXAMPLE 2

SEM Study

Figure 5:
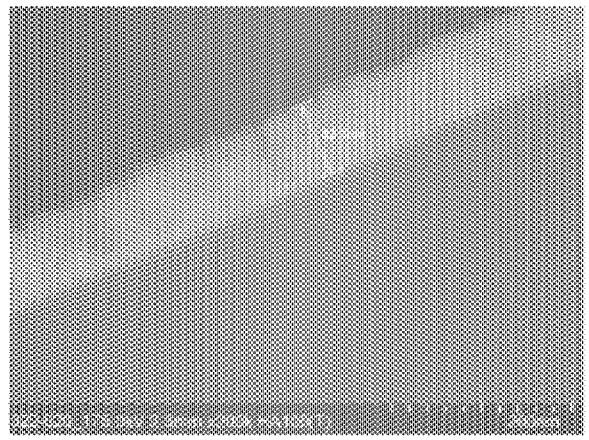
FIG. 5 and FIG. 6 are scanning electron micrograph (SEM) images of a deposited molybdenum film formed in accordance with Example 2.
Figure 6:
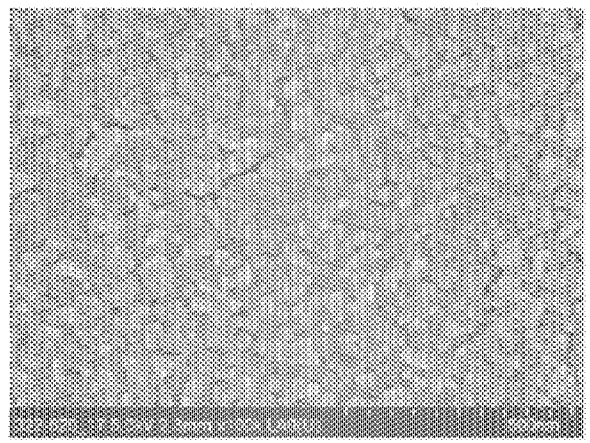

FIG. 5 and FIG. 6 are scanning electron micrograph (SEM) images of a deposited molybdenum film formed by CVD using the molybdenum oxytetrachloride ($MoOCl_4$)/ hydrogen ($H_2$) deposition process involving the following process conditions: substrate=50 Å TiN; ampoule temperature=70° C.; stage temperature=700° C.; pressure=60 torr; argon carrier gas flow rate=50 sccm; argon purge gas flow rate=0 sccm; hydrogen gas flow rate=2000 sccm; deposition time=300 seconds; TiN thickness prior to deposition=70.9 Å; TiN thickness subsequent to deposition=61.8 Å; molybdenum thickness=600.1 Å; and resistivity of the deposited molybdenum=15.1 μΩ-cm. FIG. 5 and FIG. 6 show a uniformly deposited molybdenum film with relatively large grain size.

EXAMPLE 3

Temperature and Thickness Study

Figure 7:
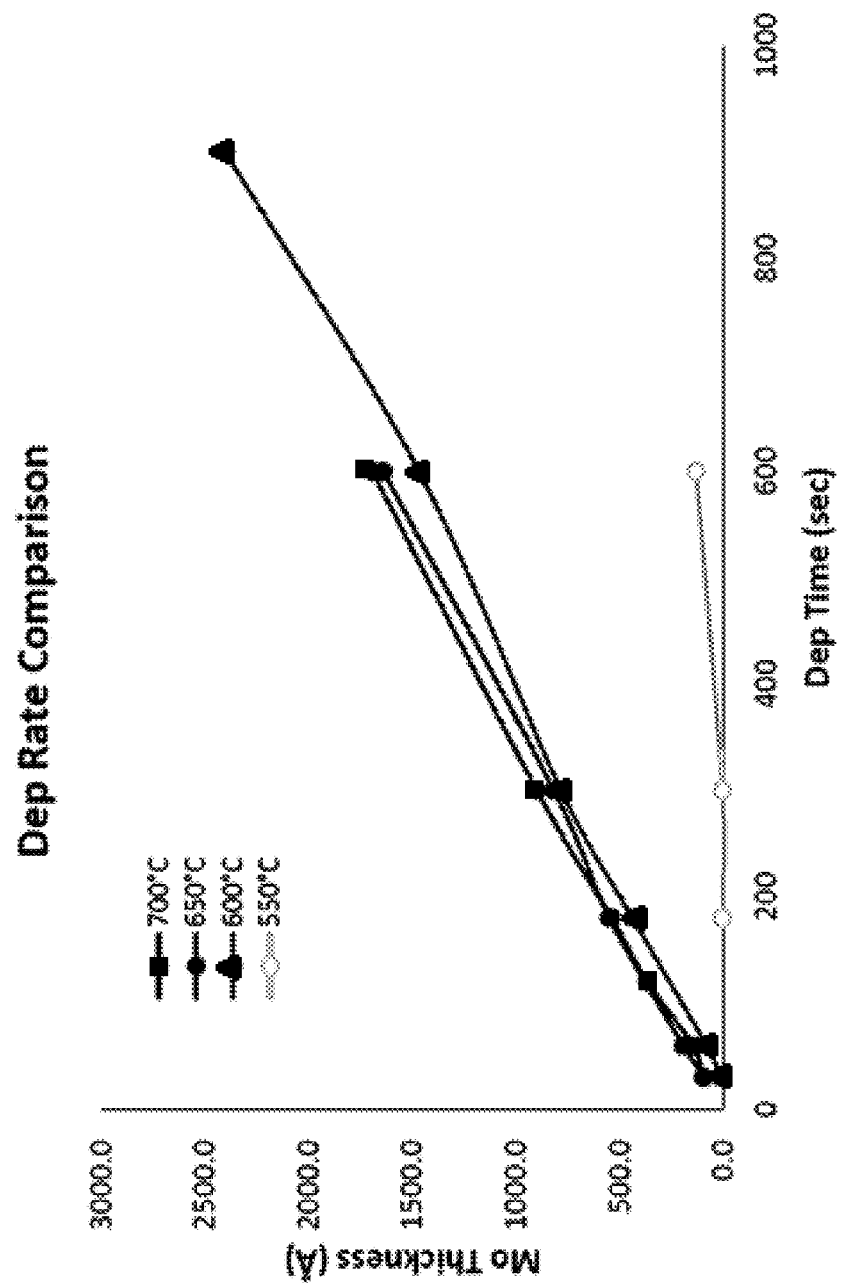
FIG. 7 is a graph of molybdenum thickness as a function of deposition time for deposition of molybdenum by a $MoOCl_4/H_2$ process in accordance with Example 3.

FIG. 7 is a graph of molybdenum thickness, in Ångströms, as a function of deposition time, in seconds, for deposition of molybdenum using the $MoOCl_4$/$H_2$ process, ampoule temperature of 70° C., pressure of 60 torr, argon carrier gas flow rate of 50 sccm, and hydrogen gas flow rate of 2000 sccm, as carried out in respective runs at stage temperature of 550° C. (bottom curve), 600° C. (second curve from bottom at 600° C.), 650° C. (third curve from bottom at 600° C.), and 700° C. (top curve at 600° C.). The chemical vapor deposition of molybdenum using the $MoOCl_4$/$H_2$ process, without a boron nucleation layer, showed temperature cut off at 550° C. Deposition rates are similar from 600° C. to 700° C. (stage temperatures).

EXAMPLE 4

Temperature and Resistivity Study

Figure 8:
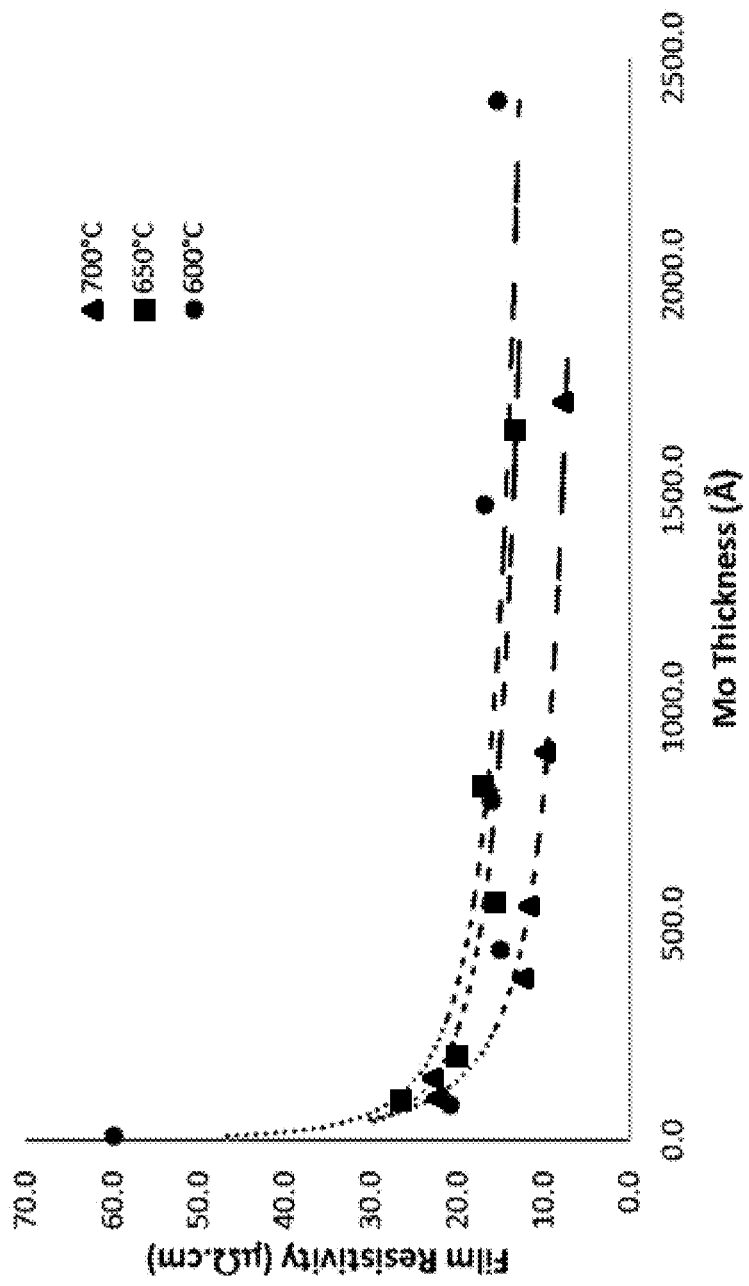
FIG. 8 is a graph of film resistivity as a function of molybdenum thickness for molybdenum deposition conducted by a $MoOCl_4/H_2$ process in accordance with Example 4.

FIG. 8 is a graph of film resistivity, in μΩ-cm, as a function of molybdenum thickness, in Ångströms, for molybdenum deposition conducted by using the $MoOCl_4$/$H_2$ process at conditions of 70° C. ampoule temperature, 60 torr pressure, 50 sccm argon carrier gas flow rate, and 2000 sccm hydrogen gas flow rate, in which the process was conducted in separate runs at temperature of 600° C. (top curve), 650° C. (middle curve) and 700° C. (bottom curve). The data show that the processes conducted at 600° C. and 650° C. showed slightly higher resistivity when compared to the 700° C. process. At 700° C. stage temperature, the film resistivity drops to approximately 11 μΩ-cm for a molybdenum film thickness in the order of 500 Å.

EXAMPLE 5

Comparison With $MoCl_5$—Long-Term Deposition Study

Figure 9:
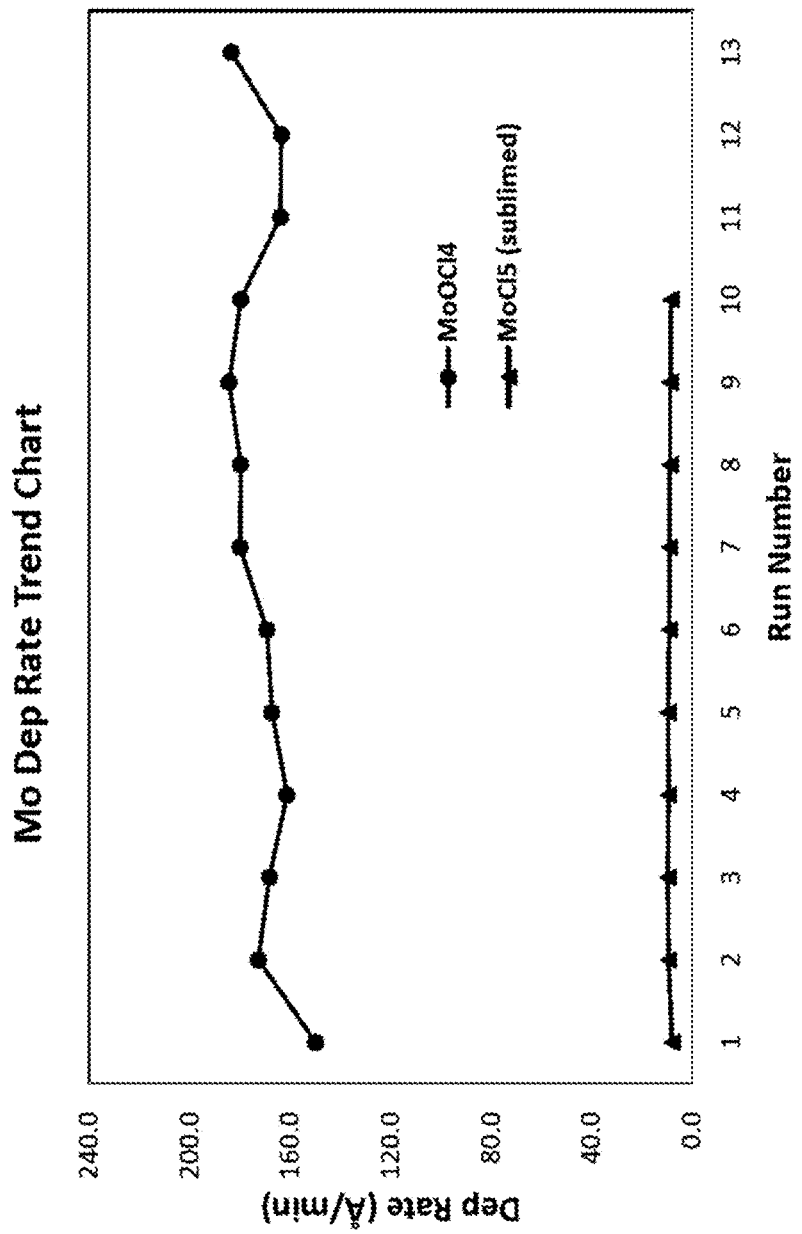
FIG. 9 is a graph comparing deposition rate as a function of run number, for molybdenum deposition in accordance with Example 5.

FIG. 9 is a graph of Mo deposition rate, in Ångströms/ minute, as a function of run number, for molybdenum deposition using molybdenum oxytetrachloride ($MoOCl_4$) as the molybdenum precursor (○), and for molybdenum deposition using sublimed molybdenum pentachloride (MoCl5) as the molybdenum precursor (Δ). The process conditions in both cases were as follows: ampoule temperature=70° C.; pressure=60 torr; argon carrier gas flow rate=50 sccm; hydrogen gas flow rate=2000 sccm.

The results in FIG. 9 show that the molybdenum deposition using molybdenum oxytetrachloride ($MoOCl_4$) as the molybdenum precursor exhibited stable and high deposition rates, whereas sublimed molybdenum pentachloride (MoCl5) showed stable and lower deposition rates.

Secondary ion mass spectrometry (SIMS) analysis of molybdenum films formed from $MoOCl_4$ verified that oxygen concentration in the bulk molybdenum is well below 1%, using a number density of approximately $6.4 \times 10^{22}$ $cm^{-3}$ for bulk molybdenum.

EXAMPLE 6

Comparison With $MoCl_5$—Resistivity Study

Figure 10:
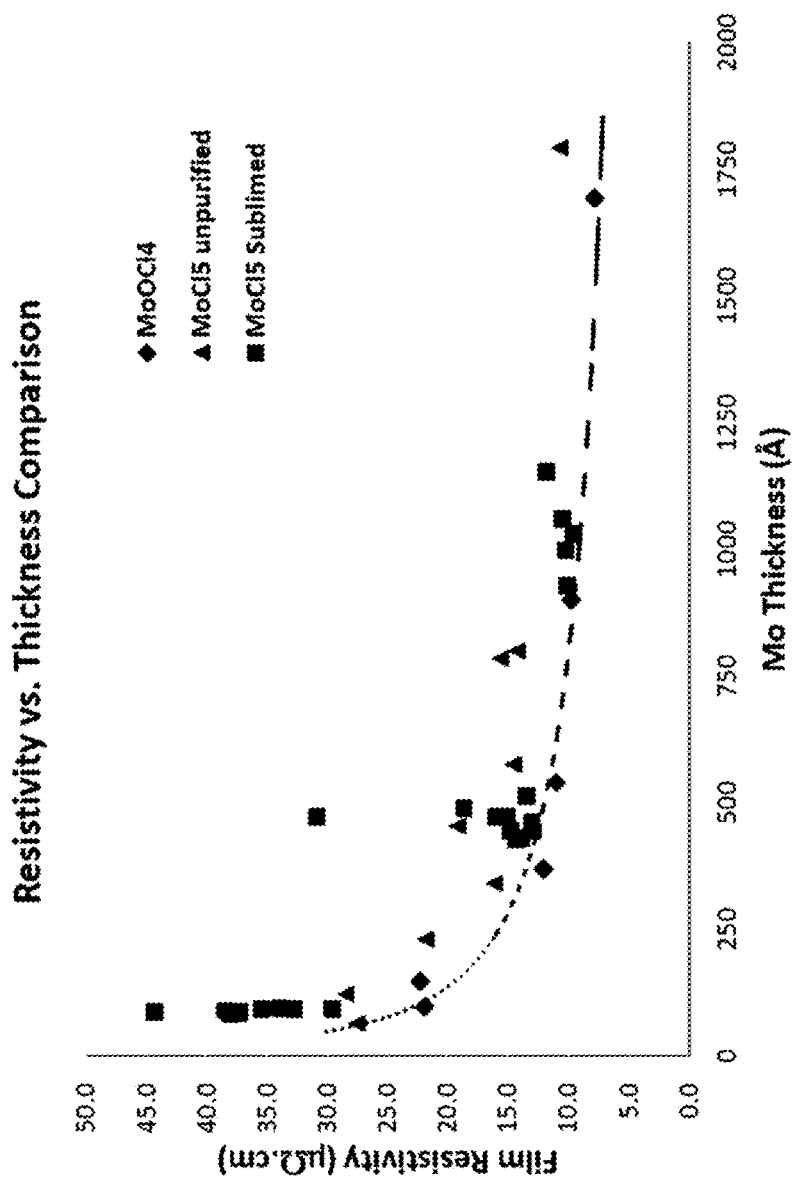
FIG. 10 is a graph comparing film resistivity of deposited molybdenum films as a function of molybdenum film thickness in accordance with Example 6.

FIG. 10 is a graph of film resistivity of deposited molybdenum films, in μΩ-cm, as a function of molybdenum film thickness, in Ångströms, for a CVD deposition process conducted at 700° C., for molybdenum film deposited using unpurified $MoCl_5$ precursor (Δ), molybdenum film deposited using sublimed $MoCl_5$ precursor (□), and molybdenum film deposited using molybdenum oxytetrachloride ($MoOCl_4$) precursor (◊). The process conditions were as follows: ampoule temperature=70° C.; pressure=60 torr; argon carrier gas flow rate=50 sccm; hydrogen gas flow rate=2000 sccm. The results show that $MoOCl_4$ precursor produced molybdenum films with lower resistivity values compared to films formed using unpurified $MoCl_5$ precursor and sublimed $MoCl_5$ precursor.

EXAMPLE 7

Diborane Soak Study

Figure 11:
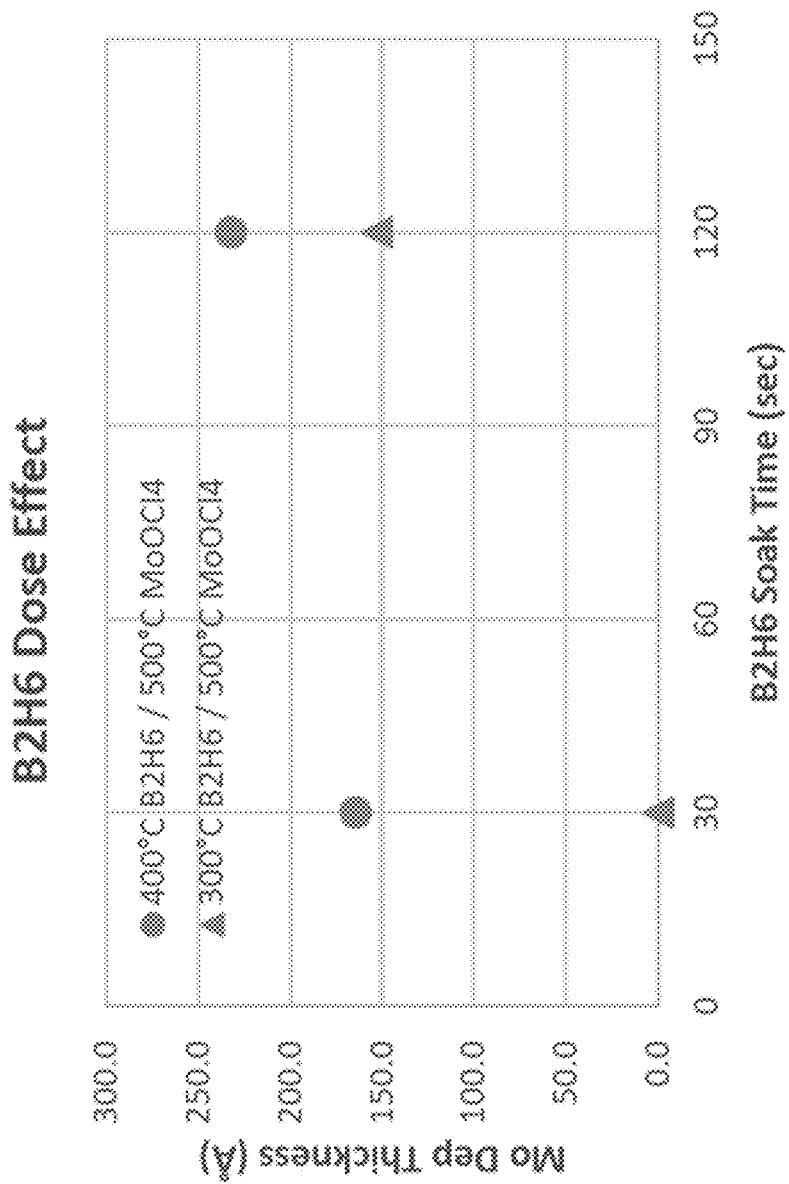
FIG. 11 is a graph of molybdenum film thickness, as a function of diborane soak time illustrating results from Example 7.

The effect of pre-soaking the substrate with diborane was investigated. FIG. 11 is a graph of molybdenum film thickness, in Ångströms, as a function of diborane soak time, in seconds, for diborane exposure at 400° C., and 500° C. bulk molybdenum deposition using molybdenum oxytetrachloride ($MoOCl_4$) precursor (○), and for diborane exposure at 300° C., and 500° C. bulk molybdenum deposition using molybdenum oxytetrachloride ($MoOCl_4$) precursor (Δ).

The results in FIG. 11 showed that the diborane exposure condition of 300° C. for 30 seconds and molybdenum oxytetrachloride ($MoOCl_4$) precursor exposure at 500° C. did not result in molybdenum deposition, and it was necessary to increase either the diborane exposure temperature or diborane soak time in order to obtain substantial molybdenum growth.

EXAMPLE 8

SEM Study—With Diborane Nucleation

Figure 12:
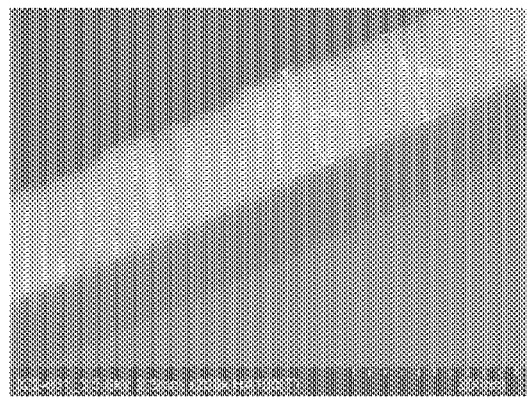
FIGS. 12 and 13 are SEM micrographs of film depositions formed in Example 8.
Figure 13:
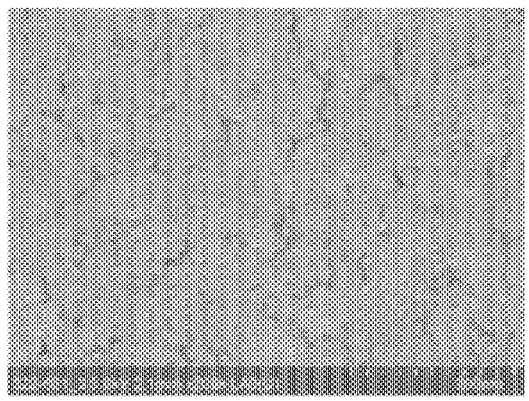

FIGS. 12 and 13 are SEM micrographs of Mo film depositions formed using 500° C. diborane nucleation, and 500° C. bulk molybdenum deposition using molybdenum oxytetrachloride ($MoOCl_4$) precursor in the presence of hydrogen. The process conditions for the diborane soak were as follows: substrate=50 Å TiN; ampoule temperature=70°

C.; pressure=40 torr; stage temperature=500° C.; diborane flow rate=35 sccm; argon carrier gas flow rate=500 sccm; hydrogen flow rate=0 sccm, duration=30 seconds. The process conditions for the $MoOCl_4/H_2$ bulk molybdenum deposition were as follows: stage temperature=500° C.; pressure=60 torr; argon carrier gas flow rate=50 sccm; hydrogen flow rate=2000 sccm; duration=300 seconds. The results showed that 500° C. diborane nucleation resulted in molybdenum deposition, but an excessive boron layer was formed under the molybdenum film. The thick B underlayer is undesirable for device performance.

EXAMPLE 9

Step Coverage—3 Cycle Diborane Nucleation Process

Molybdenum films were deposited in via trench structures using 3 cycles of boron nucleation and molybdenum bulk deposition with $MoOCl_4/H_2$. The process conditions in the diborane soak were as follows: substrate=via trench structure; ampoule temperature=70° C.; stage temperature=300° C.; pressure=40 torr; diborane flow rate=35 sccm; argon carrier gas flow rate=250 sccm; hydrogen flow rate=0 sccm, duration=60 seconds. The process conditions for the $MoOCl_4/H_2$ molybdenum deposition were as follows: stage temperature=550° C.; pressure=60 torr; argon carrier gas flow rate=50 sccm; hydrogen flow rate=2000 sccm; duration=60 seconds. The $MoOCl_4/B_2H_6$ nucleation process (3 cycles) exhibited good step coverage on the via trench structures.

The associated process chemistry includes the following proposed reactions: $MoOCl_4+3H_2 \rightarrow Mo+4\ HCl+H_2O$; and $2\ MoOCl_4+B_2H_6 \rightarrow 2\ Mo+2\ BCl_3+2\ HCl+2\ H_2O$.

X-ray diffraction measurements were made on a representative molybdenum film deposited from $MoOCl_4$ in accordance with the present disclosure, and the XRT measurement showed only Mo metal peaks, with no $MoO_2$ or $MoO_3$ peaks present.

X-ray reflectivity (XRR) measurements on a representative molybdenum film formed in accordance with the present disclosure showed ~13.4 nm molybdenum with a density of approximately 8.33 g/cm$^3$ on a 147 Å x-ray fluorescence (XRF) spectrometry-measured film.

EXAMPLE 10

Diborane Soak Time—Impact on Thickness and Resistivity

Figure 14:
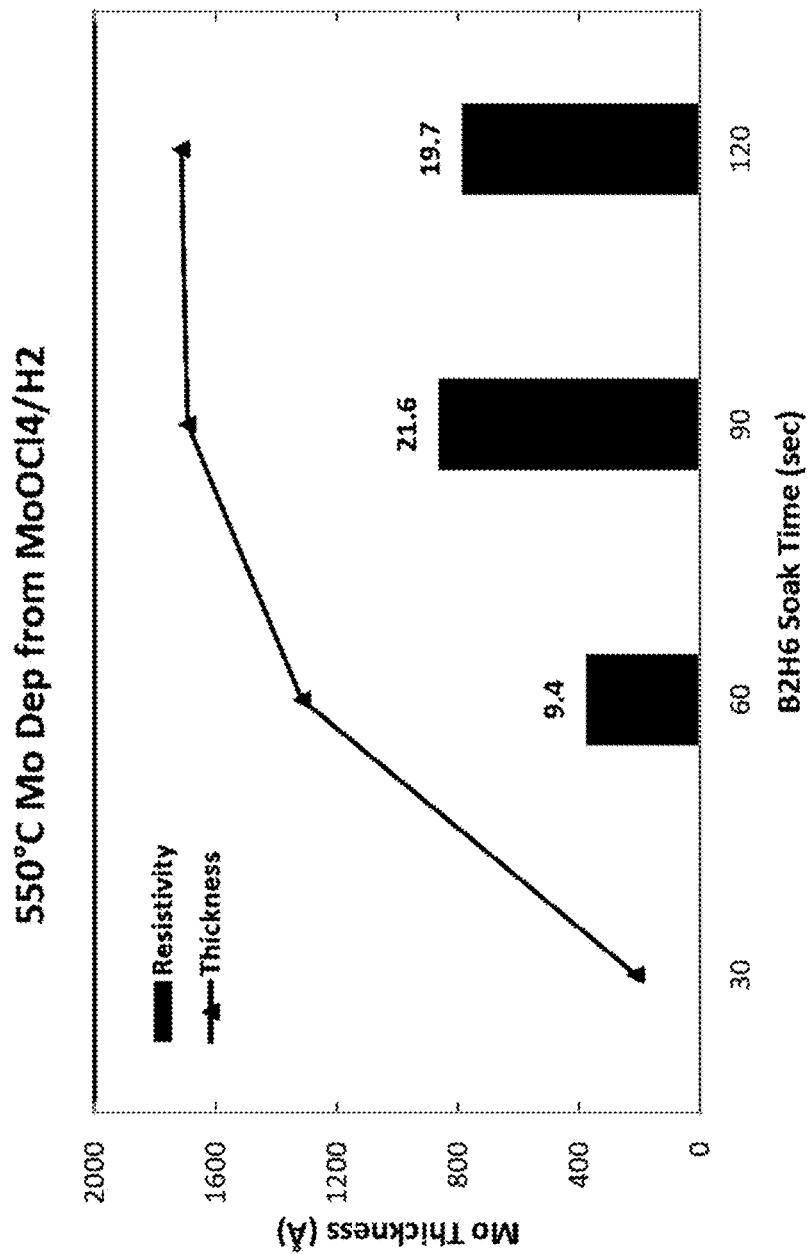
FIG. 14 is a graph of molybdenum thickness and resistivity as a function of diborane soak time for a deposition process in accordance with Example 10.

FIG. 14 is a graph of molybdenum thickness (Å), in Ångströms, and resistivity (bar graph column markers), in μΩ-cm, as a function of diborane soak time, in seconds, for a deposition process including the boron nucleation at process conditions of: stage temperature=300° C.; pressure=44; diborane flow rate=35 sccm; argon carrier gas flow rate=250 sccm, and bulk molybdenum deposition for 600 seconds, at process conditions of: stage temperature=550° C., ampoule temperature=70° C.; pressure=60 torr; argon carrier gas flow rate=50 sccm; hydrogen gas flow rate 2000 sccm, showing the diborane soak time effect. The data show that with 60 seconds or longer diborane pre-soak, molybdenum deposition is enabled at 550° C. stage temperature. As shown, film resistivity increases at longer diborane soak time periods, indicating the presence of boron within the deposited Mo film.

EXAMPLE 11

Thickness and Resistivity Study—With Diborane Nucleation

Figure 15:
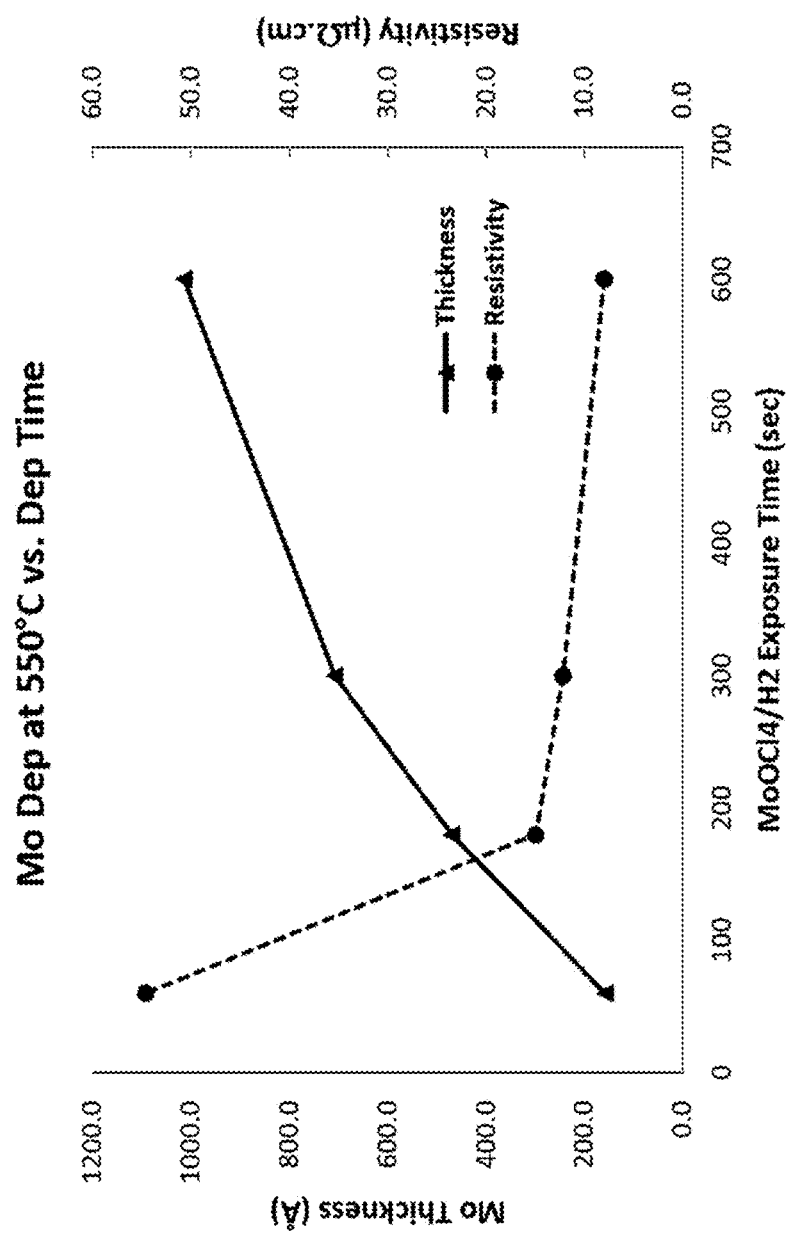
FIG. 15 is a graph of molybdenum thickness and resistivity as a function of $MoOCl_4/H_2$ exposure time, for a deposition process in accordance with Example 11.

FIG. 15 is a graph of molybdenum thickness (Å), in Ångströms, as a function of MoOCl4/$H_2$ exposure time, in seconds, and resistivity (○), in μΩ-cm, as a function of the $MoOCl_4/H_2$ exposure time, for a deposition process including a boron nucleation at the following process conditions: stage temperature=300° C.; pressure=40 torr; diborane flow rate=35 sccm; argon carrier gas flow rate=250 sccm; duration=60 seconds, and bulk molybdenum deposition at conditions: stage temperature=550° C., ampoule temperature=70° C.; pressure=60 torr; argon carrier gas flow rate=50 sccm; and hydrogen gas flow rate=2000 sccm. As shown, with a 60 second diborane pre-soak, molybdenum deposition thickness grows with $MoOCl_4/H_2$ exposure time at 550° C. Film resistivity drops below 20 μΩ-cm for thicknesses greater than 400 Å.

EXAMPLE 12

SEM Study—With Diborane Nucleation

Figure 16:
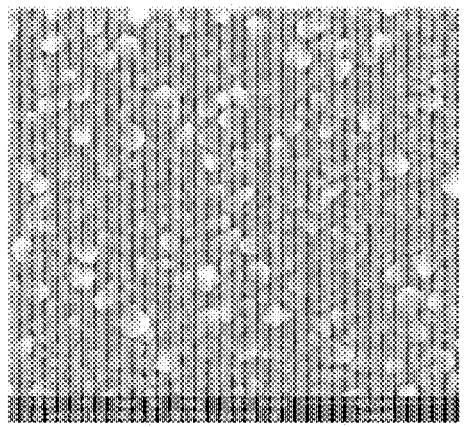
FIG. 16 is an SEM image of a molybdenum film deposited in accordance with Example 12.
Figure 17:
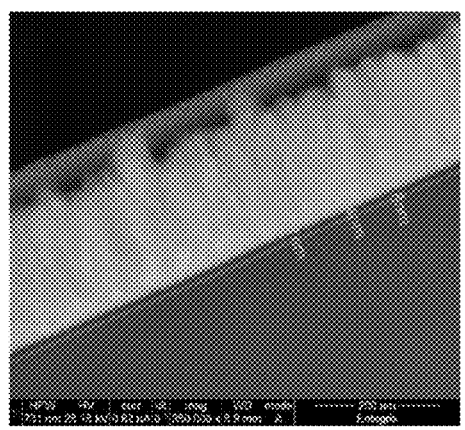
FIG. 17 is an SEM cross-section image of a molybdenum film deposited in accordance with Example 12.

FIG. 16 is an SEM image of a molybdenum film deposited at a stage temperature of 550° C., and FIG. 17 is an SEM cross-section image of such film, as deposited at the following diborane soak process conditions: substrate=50 Å TiN; ampoule temperature=70° C.; stage temperature=300° C.; pressure=40 torr; diborane flow rate=35 sccm; argon carrier gas flow rate=250 sccm; hydrogen gas flow rate=0 sccm; and duration=90 seconds, followed by bulk molybdenum deposition by using $MoOCl_4/H_2$ process at the following process conditions: stage temperature=550° C.; pressure=60 torr; argon carrier gas flow rate=50 sccm; hydrogen gas flow rate=2000 sccm; and duration=600 seconds (one cycle). The XRF thickness of the film was measured as 1693.6 Å, and the resistivity was determined to be 21.6 μΩ-cm. The SEM images showed approximately 40-70 nm grain size for molybdenum deposited at 550° C. with 90 seconds diborane pre-soak. The cross-sectional SEM image shows approximately 7.7 nm boron layer underneath the deposited molybdenum.

EXAMPLE 13

Stage Temperature Study—With an Without Diborane Nucleation

Figure 18:
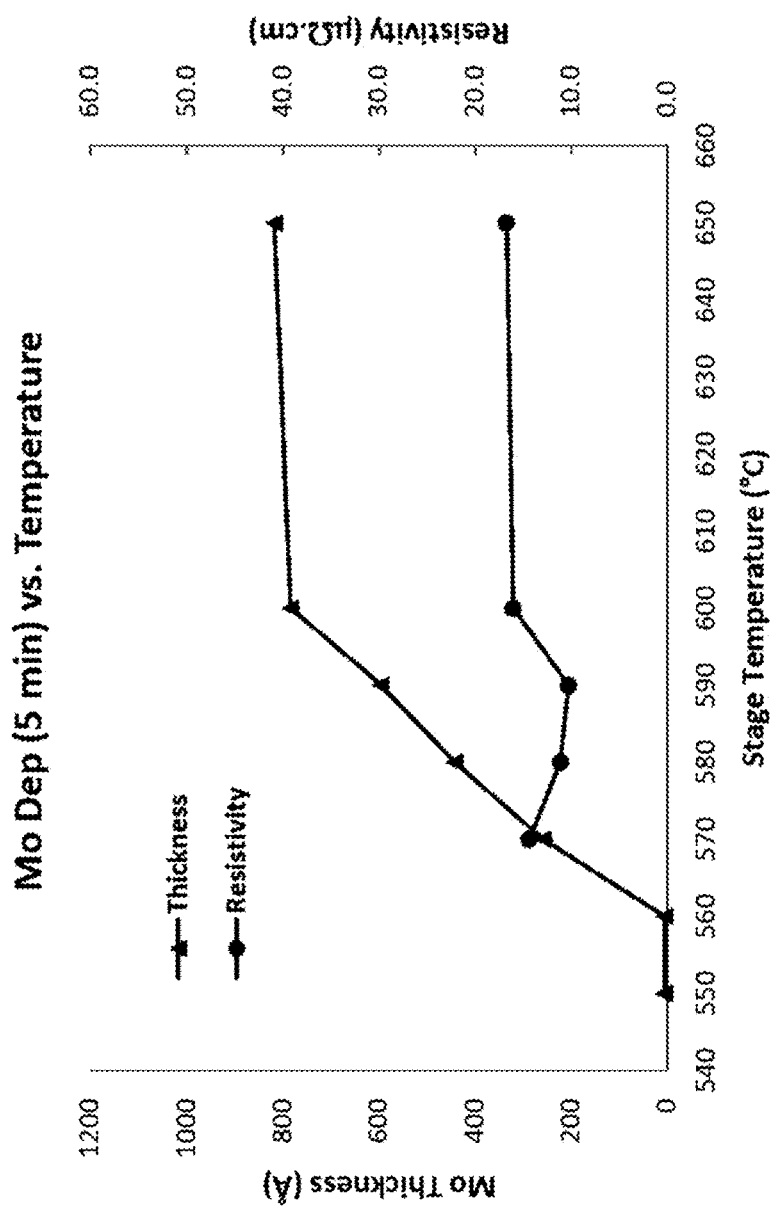
FIG. 18 is a graph of molybdenum thickness and resistivity as a function of stage temperature, showing a reaction rate limited regime for the $MoOCl_4/H_2$ process without diborane nucleation, according to Example 13.

FIG. 18 is a graph of molybdenum thickness (Å), in Ångströms, as a function of stage temperature, in degrees Centigrade, and resistivity, (○), in μΩ-cm, as a function of the stage temperature, showing a reaction rate limited regime for the $MoOCl_4/H_2$ process with diborane nucleation, as conducted at diborane nucleation conditions of: stage temperature=300° C.; pressure=40 torr; diborane flow rate=35 sccm; argon carrier gas flow rate=250 sccm; duration=60 seconds, and at bulk molybdenum deposition process conditions of: ampoule temperature=70° C., pressure=60 torr; argon carrier gas flow rate=50 sccm; hydrogen gas flow rate=2000 sccm; duration=5 minutes. The data show that with diborane nucleation, molybdenum deposition cutoff temperature is reduced to 500° C. with rapid Mo deposition rate drop off between stage temperatures of 500° C. and 540° C.

Figure 19:
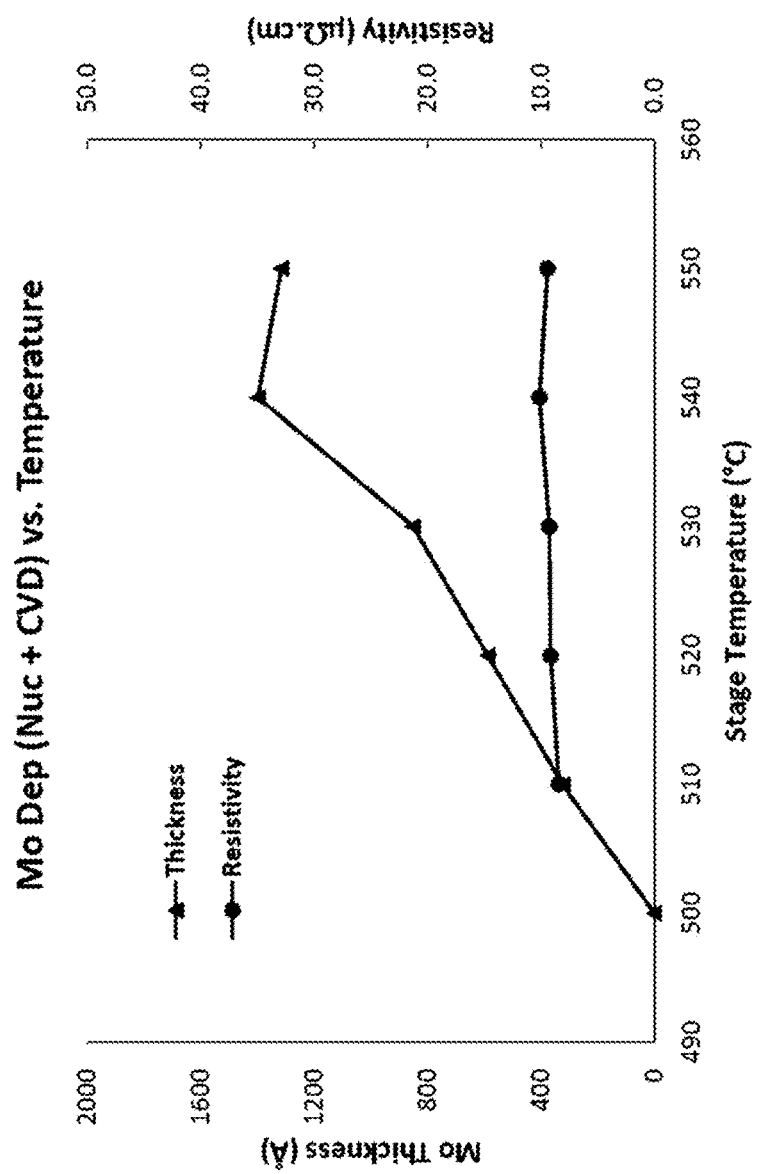
FIG. 19 is a graph of molybdenum thickness and resistivity as a function of stage temperature, showing a reaction rate limited regime for the $MoOCl_4/H_2$ process with diborane nucleation, according to Example 13.

FIG. 19 is a graph of molybdenum thickness (Å), in Ångströms, as a function of stage temperature, in degrees Centigrade, and resistivity, (○), in µΩ-cm, as a function of the stage temperature, showing a reaction rate limited regime for the MoOCl$_4$/H$_2$ process without diborane nucleation, as conducted at process conditions of: ampoule temperature=70° C., pressure=60 torr; argon carrier gas flow rate=50 sccm; hydrogen gas flow rate=2000 sccm; duration=5 minutes. The data show that Mo deposition rates for the CVD process, without diborane nucleation, drop-off rapidly below stage temperatures of 600° C., with a cutoff stage temperature at approximately 560° C.

EXAMPLE 14

Arrhenius Plot—With and Without Diborane Nucleation

Figure 20:
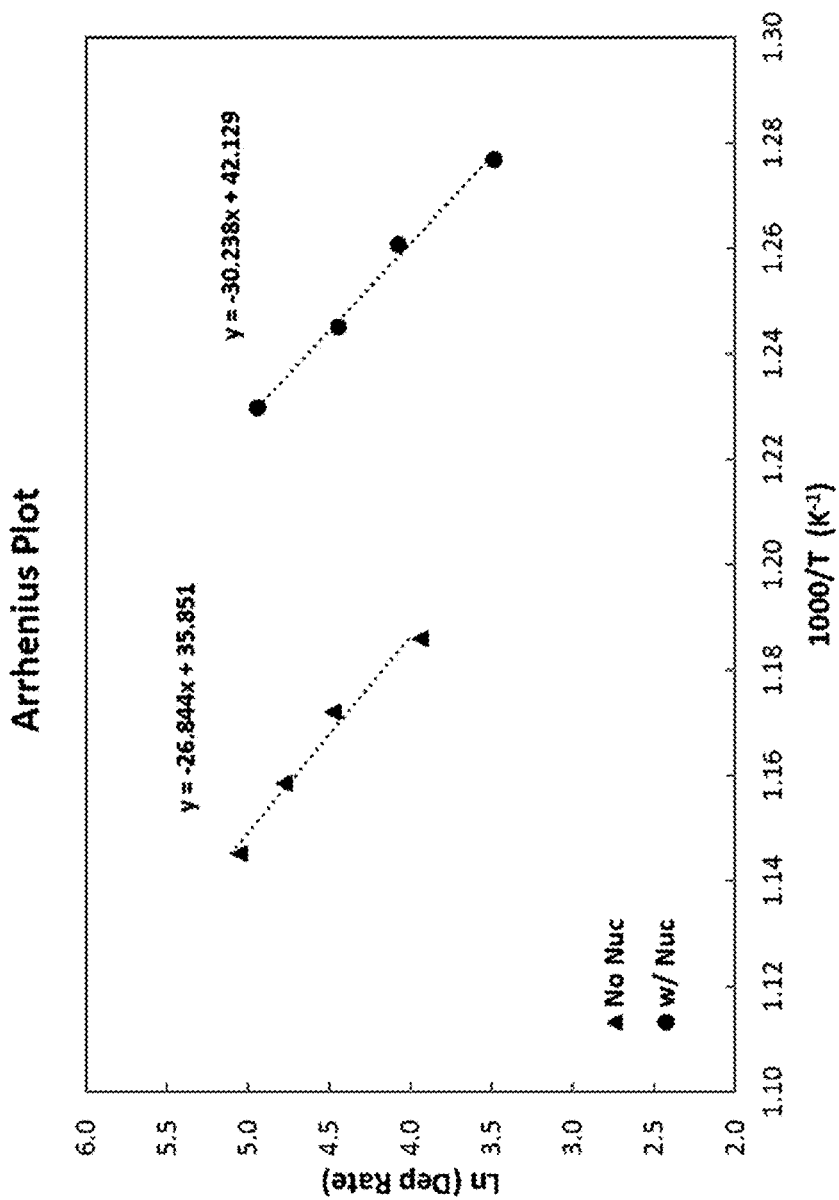
FIG. 20 is an Arrhenius plot ($K=A^{e-Ea/RT}$) of activation energy for the $MoOCl_4/H_2$ reaction, as conducted without nucleation (Δ), and as conducted with nucleation (○).

FIG. 20 is an Arrhenius plot (K=A$e^{-Ea/RT}$) of activation energy for the MoOCl$_4$/H$_2$ reaction, as conducted without boron nucleation (Δ), and as conducted with boron nucleation (○). The data show that the extracted activation energy for the MoOCl$_4$/H$_2$ reaction is approximately 251 kJ/mole for the bulk molybdenum process deposition without boron nucleation, and approximately 233 kJ/mole for the bulk molybdenum deposition process with diborane nucleation.

EXAMPLE 15

Step Coverage

The following conditions were used to coat molybdenum on a reentrant via trench structure by boron nucleation and CVD bulk molybdenum deposition using MoOCl$_4$/H$_2$ process: substrate=via trench structures; ampoule temperature=70° C., with the diborane nucleation (soak) process conducted at the process conditions of: stage temperature=300° C.; pressure=40 torr; diborane flow rate=35 sccm; argon carrier gas flow rate=250 sccm; hydrogen gas flow rate=0 sccm; duration=60 seconds, and with the bulk molybdenum deposition CVD process carried out at conditions of: stage temperature=520° C.; pressure=60 torr; argon carrier gas flow rate=50 sccm; hydrogen gas flow rate=2000 sccm; and duration=600 seconds. The 520° C. MoOCl$_4$/H$_2$ process with one cycle of diborane nucleation showed approximately 50% step coverage (bottom via thickness/top film thickness) on the via structure.

EXAMPLE 16

Step Coverage—Impact of Deposition Time

Three reentrant via trench structures were coated with molybdenum after diborane nucleation (soak) and 520° C. CVD bulk molybdenum deposition using MoOCl$_4$/H$_2$ process, at bulk deposition process times of 300 seconds, 450 seconds, and 600 seconds, respectively. The process conditions were as follows: substrate=via trench structures; ampoule temperature=70° C., with the diborane nucleation (soak) process conducted at the process conditions of: stage temperature=300° C.; pressure=40 torr; diborane flow rate=35 sccm; argon carrier gas flow rate=250 sccm; hydrogen gas flow rate=0 sccm; duration=60 seconds, and with the bulk molybdenum deposition CVD process carried out at conditions of: stage temperature=520° C.; pressure=60 torr; argon carrier gas flow rate=50 sccm; hydrogen gas flow rate=2000 sccm; and duration=300 seconds, 450 seconds and 600 seconds. The 520° C. MoOCl$_4$/H$_2$ process with one cycle of diborane nucleation exhibited gradually degraded step coverage on the via structure with increasing deposition time. At 600 seconds of deposition time, the upper region of the trench was constricted, leading to loss of conformality.

EXAMPLE 17

Step Coverage—Impact of Temperature

Three reentrant via trench structures were coated with molybdenum after diborane nucleation (soak) and CVD bulk molybdenum deposition using MoOCl$_4$/H$_2$ process, at bulk deposition temperature of 510° C., 520° C., and 530° C., respectively. The process conditions were as follows: substrate=via trench structures; ampoule temperature=70° C., with the diborane nucleation (soak) process conducted at the process conditions of: stage temperature=300° C.; pressure=40 torr; diborane flow rate=35 sccm; argon carrier gas flow rate=250 sccm; hydrogen gas flow rate=0 sccm; duration=60 seconds, and with the bulk molybdenum deposition CVD process carried out at conditions of: stage temperature=510° C., 520° C., and 530° C.; pressure=60 torr; argon carrier gas flow rate=50 sccm; hydrogen gas flow rate=2000 sccm; and duration=600 seconds. The 510° C. MoOCl$_4$/H$_2$ process exhibited poor step coverage due to rough Mo film morphology. The 520° C. process showed approximately 50% step coverage on the via trench structure. The step coverage degraded to about 30% for the 530° C. process.

EXAMPLE 18

Step Coverage—Impact of Diborane Soak Time

Three reentrant via trench structures were coated with molybdenum after diborane nucleation (soak) and CVD bulk molybdenum deposition using MoOCl$_4$/H$_2$ process, at diborane dose (soak) times of 45, 60 seconds, and 75 seconds, respectively. The process conditions were as follows: substrate=via trench structures; ampoule temperature=70° C., with the diborane nucleation (soak) process conducted at the process conditions of: stage temperature=300° C.; pressure=40 torr; diborane flow rate=35 sccm; argon carrier gas flow rate=250 sccm; hydrogen gas flow rate=0 sccm, and with the bulk molybdenum deposition CVD process carried out at conditions of: stage temperature=520° C.; pressure=60 torr; argon carrier gas flow rate=50 sccm; hydrogen gas flow rate=2000 sccm; and duration=450 seconds. A boron layer was clearly visible underneath the deposited molybdenum for the 60 second and 75 seconds diborane soak conditions, indicating the boron nucleation layer was too thick for practical use.

EXAMPLE 19

Step Coverage—Pulsing at 60 Torr

A reentrant via trench structure was coated with molybdenum after diborane nucleation (soak) and CVD bulk molybdenum deposition using MoOCl$_4$/H$_2$ process, involving a pulsed CVD process conducted at 60 torr for 120 cycles, the via having an upper portion with a molybdenum film thickness of 510 Å, a lower portion with a molybdenum film thickness of 375 Å, and an intermediate sidewall portion having a molybdenum film thickness of 480 Å, at the following process conditions: substrate=via trench structures; ampoule temperature=70° C., with the diborane nucleation (soak) process conducted at the process conditions of: stage temperature=300° C.; pressure=40 torr; diborane flow rate=35 sccm; argon carrier gas flow rate=250 sccm; hydrogen gas flow rate=0 sccm; and duration=45 seconds, and with the pulsed molybdenum deposition CVD process carried out at conditions of: stage temperature=520° C.; pressure=60 torr; argon carrier gas flow rate=50 sccm; hydrogen gas flow rate=2000 sccm; pulse duration=5 seconds; purge duration=10 seconds; and number of cycles=120. The pulsed CVD process with 10 second purge between each pulse exhibited a reduced build up near the constricted neck of the structure. Step coverage was on the order of 75% for a bulk molybdenum deposition of approximately 500 Å thickness.

EXAMPLE 20

Step Coverage—Pulsing at 40 Torr

A reentrant via trench structure was coated with molybdenum after diborane nucleation (soak) and CVD bulk molybdenum deposition $MoOCl_4/H_2$ process, involving a pulsed CVD process conducted at 40 torr for 120 cycles, the via having an upper portion having a molybdenum film thickness of 320 Å, an intermediate sidewall portion having a molybdenum film thickness of 520 Å, and the via bottom having a molybdenum film thickness of 460 Å, wherein the process was conducted at the following process conditions: substrate=via trench structures; ampoule temperature=70° C., with the diborane nucleation (soak) process conducted at the process conditions of: stage temperature=300° C.; pressure=40 torr; diborane flow rate=35 sccm; argon carrier gas flow rate=250 sccm; hydrogen gas flow rate=0 sccm; and duration=45 seconds, and with the pulsed molybdenum deposition CVD process carried out at conditions of: stage temperature=520° C.; pressure=40 torr; argon carrier gas flow rate=50 sccm; hydrogen gas flow rate=2000 sccm; pulse duration=5 seconds; purge duration=10 seconds; and number of cycles=120. The pulsed CVD process at 40 torr showed excellent step coverage, with thinner deposition on top and thicker deposition inside the via trench cross-sectional profile. Nominal step coverage on this via structure exceeded 100%.

EXAMPLE 21

Step Coverage—Pulsing at 40 Torr—Increased Number of Cycles

A reentrant via trench structure was coated with molybdenum after diborane nucleation (soak) and CVD bulk molybdenum deposition $MoOCl_4/H_2$ process, involving a pulsed CVD process conducted at 40 torr for 240 cycles, the via trench having an intermediate sidewall portion with a molybdenum film thickness of 720 Å, and a lower via trench bottom with a molybdenum film thickness of 460 Å, wherein the process was conducted at the following process conditions: substrate=via trench structures; ampoule temperature=70° C., with the diborane nucleation (soak) process conducted at the process conditions of: stage temperature=300° C.; pressure=40 torr; diborane flow rate=35 sccm; argon carrier gas flow rate=250 sccm; hydrogen gas flow rate=0 sccm; and duration=45 seconds, and with the pulsed molybdenum deposition CVD process carried out at conditions of: stage temperature=520° C.; pressure=40 torr; argon carrier gas flow rate=50 sccm; hydrogen gas flow rate=2000 sccm; pulse duration=5 seconds; purge duration=10 seconds; and number of cycles=240. Increasing the number of cycles at 40 torr pressure, from 120 to 240 did not result in a void-free, bottom-up fill due to pinch-off at the via constricted neck region.

EXAMPLE 22

Etch Rates

The etch rate of a $MoOCl_4/H_2$ process on boron nucleation surfaces (CVD B) was explored. The process was carried out at conditions of: stage temperature=500° C.; pressure=20 torr; argon carrier gas flow rate=50 sccm; hydrogen gas flow rate=2000 sccm. Further conditions and the observed etch rate testing results are shown in Table 1:

TABLE 1

| Example | Substrate | Under layer | Air exposure | Etch time (s) | Start thickness (Å) | End thickness (Å) | Etch rate (Å/min) |
|---|---|---|---|---|---|---|---|
| 22C | CVD B | 1 kÅ Mo | >50 hr | 600 | 2835 | 2630 | 20 |
| 22H | CVD B | 1 kÅ Mo | >50 hr | 1200 | 2715 | 2525 | 10 |
| 22M | CVD B | 30 Å TiN | 0 | 300 | 280 (avg) | 274 | 1 |
| 22N | CVD B | 30 Å TiN | 2 hr | 300 | 278 | 272 | 1 |
| 22O | CVD B | 30 Å TiN | 50 hr | 300 | 287 | 283 | 1 |

The measured etch rate was not impacted by exposure to air. The etch rate of thick boron film on a Mo substrate was much higher than a boron film on TiN substrate. This may be due to surface roughness of the thick boron films.

EXAMPLE 23

Other Substrates

The $MoOCl_4/H_2$ process was carried out on a range of thin-film substrates. The process was carried out at conditions of: stage temperature=500° C.; pressure=60 torr; argon carrier gas flow rate=50 sccm; hydrogen gas flow rate=2000 sccm. Further detailed process conditions and the resulting Mo film properties on various substrates are shown in Table 2:

TABLE 2

| Example | Substrate | Stage temperature (° C.) | Mo thickness (Å) | Mo resistivity (μΩ-cm) |
|---|---|---|---|---|
| 23A | 1000 Å PVD Mo | 500 | 148 | 6.5 |
| 23B | 1000 Å PVD Mo | 560 | 902 | 6.3 |
| 23C | ~50 Å CVD B | 510 | 470 | 8.9 |
| 23D | ~50 Å CVD B | 550 | 656 | 7 |
| 23E | 150 Å MoC | 500 | 940 | 25.3 |
| 23F | 136 Å MoC | 550 | 953 | 17.1 |

TABLE 2-continued

| Example | Substrate | Stage temperature (° C.) | Mo thickness (Å) | Mo resistivity (μΩ-cm) |
|---|---|---|---|---|
| 23G | 178 Å TiN | 560 | 165 | 256.3 |
| 23H | 175 Å TiN | 600 | 877 | 30 |
| 23I | 177 Å TiN | 650 | 1750 | 9.3 |
| 23J | 1000 Å SiO$_2$ | 540 | 300 | 30.5 |
| 23K | 1000 Å CVD W | 500 | 126 | 5.2 |
| 23L | 1000 Å CVD W | 650 | 1989 | 7.5 |
| 23M | 25 Å WCN | 500 | 273 | 46 |
| 23N | 25 Å WCN | 600 | 1801 | 16 |

The deposited molybdenum exhibited a wide range of film resistivity. Resistivity did not vary with thickness where the substrate was PVD Mo. As noted from previous results, resistivity was very dependent on stage temperature of TiN substrates without a boron nucleation layer. We also observed that film resistivity depends upon the deposited film morphology.

Discussion

The foregoing shows that CVD molybdenum films deposited using MoOCl$_4$ precursor showed good film resistivity of less than 15 μΩ-cm at thickness of 400 Å, and SIMS analyses showed oxygen concentration in the bulk molybdenum film to be well below 1 atomic percent for films deposited using MoOCl$_4$ precursor. On a TiN substrate the CVD MoOCl$_4$/H$_2$ process exhibited deposition temperature cut off at approximate 560° C. without diborane nucleation, and cut off at approximately 500° C. with diborane nucleation. Activation energy extracted from Arrhenius plot is approximately 223 kJ/mole for the process without nucleation, and approximately 251 kJ/mole for the process with diborane nucleation. The CVD MoOCl$_4$/H$_2$ process with diborane nucleation exhibited excellent step coverage on via structures, and the pulsed CVD process was demonstrated to achieve and even exceed 100% step coverage at film thickness of 500 Å.

While the disclosure has been set forth herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the disclosure as hereinafter claimed is intended to be broadly construed and interpreted, as including all such variations, modifications and alternative embodiments, within its spirit and scope.

Throughout the description and claims of this specification, the words "comprise" and "contain" and variations of the words, for example "comprising" and "comprises", mean "including but not limited to", and do not exclude other components, integers or steps. Moreover the singular encompasses the plural unless the context otherwise requires: in particular, where the indefinite article is used, the specification is to be understood as contemplating plurality as well as singularity, unless the context requires otherwise.

Optional features of each aspect of the invention may be as described in connection with any of the other aspects. Within the scope of this application it is expressly intended that the various aspects, embodiments, examples and alternatives set out in the preceding paragraphs and in the claims and drawings, and in particular the individual features thereof, may be taken independently or in any combination. That is, all embodiments and/or features of any embodiment can be combined in any way and/or combination, unless such features are incompatible.

The invention claimed is:

1. A method of forming a molybdenum-containing material on a substrate, comprising establishing a nucleation surface on the substrate by contacting the substrate with vapor consisting of diborane vapor and optionally separately with molybdenum oxytetrachloride (MoOCl$_4$) vapor and contacting the nucleation surface of the substrate with molybdenum oxytetrachloride (MoOCl$_4$) vapor under vapor deposition conditions, to deposit the molybdenum-containing material on the substrate.

2. The method of claim 1, wherein establishing the nucleation surface comprises a plurality of cycles of contacting the substrate with vapor consisting of diborane vapor and separately with molybdenum oxytetrachloride (MoOCl$_4$) vapor.

3. The method of claim 1, wherein the contact of the substrate with vapor consisting of diborane vapor is conducted at temperature in a range of from 300° C. to 450° C.

4. The method of claim 1, wherein the vapor deposition conditions are pulsed vapor deposition conditions.

5. The method of claim 1, wherein the vapor conditions are selected such that the deposited molybdenum-containing material has a resistivity of at most 20 μΩ·cm.

6. The method of claim 1, wherein the molybdenum-containing material is deposited at a temperature in the range of from 400° C. to 600° C.

7. The method of claim 1, comprising volatilizing molybdenum oxytetrachloride (MoOCl$_4$) to form said molybdenum oxytetrachloride (MoOCl$_4$) vapor.

8. The method of claim 1, wherein said vapor deposition conditions comprise a reducing ambient so that the molybdenum-containing material comprises elemental molybdenum material.

9. The method of claim 1, wherein the molybdenum-containing material comprises molybdenum oxide.

10. The method of claim 1, wherein the substrate comprises one or more of TiN, Mo, MoC, B, SiO$_2$, W, and WCN.

11. The method of claim 1, wherein: the substrate comprises a semiconductor device substrate comprising silicon dioxide having a titanium nitride layer thereon; the method comprises forming a nucleation surface on the titanium nitride layer; and the molybdenum-containing material is deposited on the nucleation layer.

12. The method of claim 11, wherein the nucleation surface is formed by pulsed CVD or ALD deposition comprising contact of the titanium nitride layer with diborane vapor and separately with molybdenum oxytetrachloride (MoOCl$_4$) vapor.

13. The method of claim 1 carried out in a process for making a semiconductor device on the substrate.

14. The method of claim 13, wherein the semiconductor device comprises at least one of a DRAM device and a 3-D NAND device.

15. The method of claim 1, wherein the substrate comprises a via in which the molybdenum-containing material is deposited.

16. The method of claim 1, wherein the molybdenum-containing material is deposited on the substrate at step coverage of from 90% to 110%.

17. A method of forming a molybdenum-containing material on a semiconductor device substrate comprising silicon dioxide having a titanium nitride layer thereon, the method comprising: forming a nucleation surface on the titanium nitride layer by contacting the titanium nitride layer with vapor consisting of diborane vapor, contacting the nucleation surface with molybdenum oxytetrachloride (MoOCl$_4$) vapor under vapor deposition conditions, to deposit the molybdenum-containing material on the substrate, wherein the vapor conditions are selected such that the deposited molybdenum-containing material has a resistivity of at most 20 μΩ·cm.

\* \* \* \* \*